United States Patent
Lee

(10) Patent No.: US 6,954,510 B2
(45) Date of Patent: Oct. 11, 2005

(54) PHASE-LOCKED LOOP LOCK DETECTOR CIRCUIT AND METHOD OF LOCK DETECTION

(75) Inventor: Jae-wook Lee, Seoul (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 813 days.

(21) Appl. No.: 09/847,790

(22) Filed: May 2, 2001

(65) Prior Publication Data

US 2002/0094054 A1 Jul. 18, 2002

(30) Foreign Application Priority Data

Sep. 21, 2000 (KR) .......................................... 2000-55481

(51) Int. Cl.[7] .............................. H03D 3/24; H04L 7/00
(52) U.S. Cl. ........................ 375/373; 375/371; 375/354
(58) Field of Search .............................. 375/354, 371, 375/373, 374, 375, 376; 307/510, 511, 525, 527; 327/12, 159; 331/1

(56) References Cited

U.S. PATENT DOCUMENTS

| | | | | |
|---|---|---|---|---|
| 4,959,617 A | * | 9/1990 | Martin | .......................... 327/12 |
| 5,126,602 A | * | 6/1992 | Lee et al. | ....................... 327/10 |
| 5,455,540 A | * | 10/1995 | Williams | ...................... 331/1 A |
| 5,640,523 A | * | 6/1997 | Williams | ...................... 375/360 |
| 5,834,950 A | * | 11/1998 | Co et al. | ........................ 327/12 |
| 5,923,190 A | * | 7/1999 | Yamaguchi | ................... 327/12 |
| 6,081,572 A | * | 6/2000 | Filip | ........................... 375/376 |
| 6,114,889 A | * | 9/2000 | Lee | .............................. 327/159 |

* cited by examiner

Primary Examiner—Chieh M. Fan
Assistant Examiner—Jason M. Perilla
(74) Attorney, Agent, or Firm—F. Chau & Associates, LLC

(57) ABSTRACT

There is provided a phase-locked loop lock detector circuit for detecting a lock or unlock state of a PLL circuit. A synchronization circuit synchronizes a lock window signal with a reference frequency signal. A rising edge detection circuit and a falling edge detection circuit output a state of an error signal at a rising edge of an output signal of the synchronization circuit and at a rising edge of an inverted lock window signal, respectively. A logic circuit performs an AND operation on outputs of the detection circuits, and outputs a signal indicating the lock or unlock state.

14 Claims, 8 Drawing Sheets

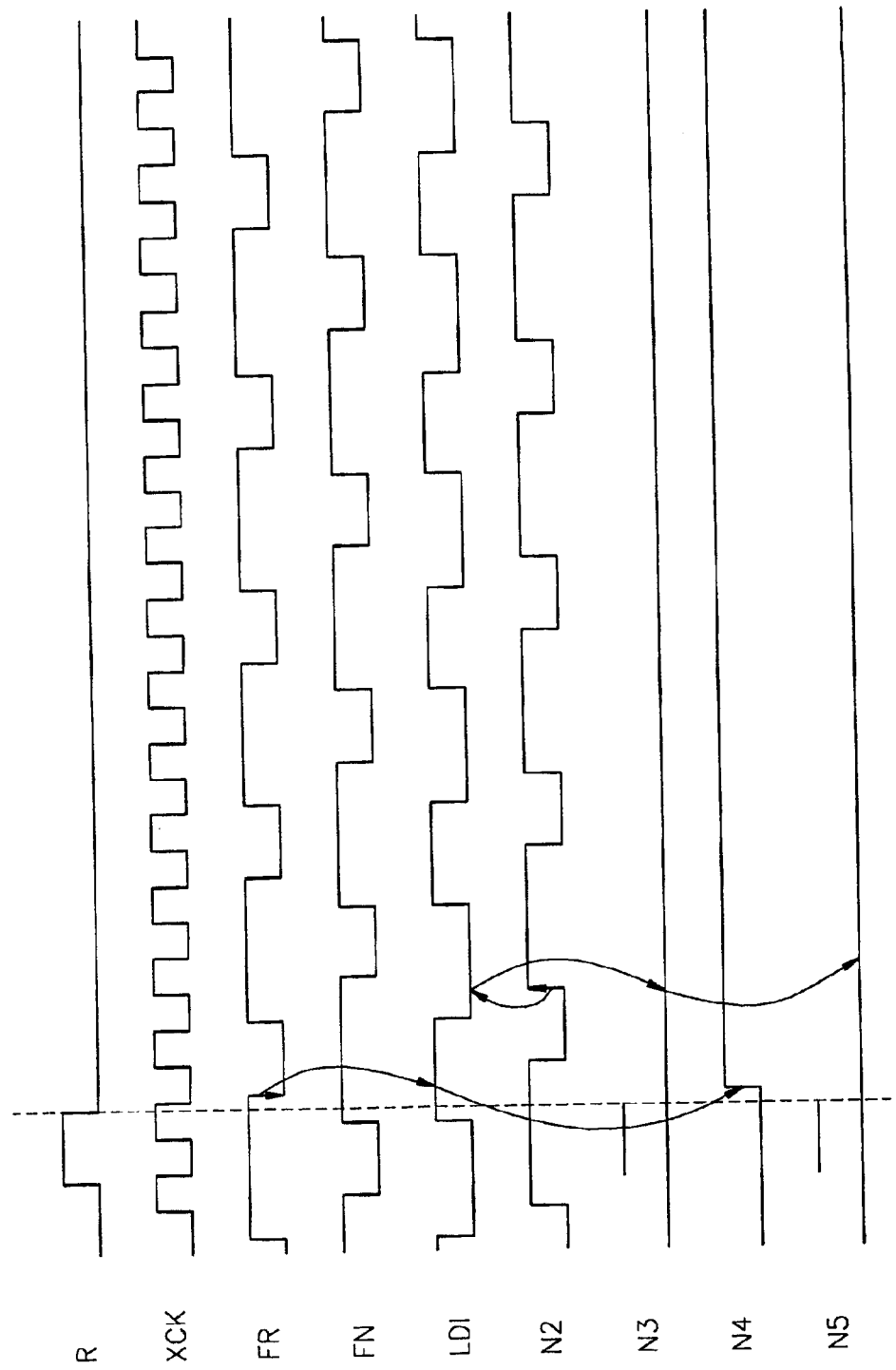

PHASE-LOCKED LOOP LOCK DETECTOR CIRCUIT AND METHOD OF LOCK DETECTION

BACKGROUND OF THE INVENTION

1. Technical Field

The present invention relates to phase-locked loops (PLLs) and, in particular, to a PLL lock detector circuit and a method of lock detection.

2. Description of Related Art

PLLs are useful in microprocessors and in the field of mobile communication. When power is turned on, a microprocessor is maintained at a reset state until a voltage controlled oscillation (VCO.) Frequency becomes the same as the normal operation frequency of the microprocessor. That is, the microprocessor is maintained at the reset state until a PLL is locked, to prevent the microprocessor from erroneously operating because of an improper frequency. Apparatuses such as frequency sensitive mobile communication devices use such a microprocessor, so PLLs are particularly essential to these apparatuses.

FIG. 1 is a block diagram illustrating a conventional PLL. The conventional PLL includes a first frequency divider 10, an error signal generator 11, a phase detector circuit 12, a low-pass filter 13, a voltage controlled oscillator 14 and a second frequency divider 15.

The first frequency divider 10 divides a reference frequency XCK by a predetermined number. The second frequency divider 15 divides an output frequency $f_0$ of the voltage controlled oscillator 14 by a predetermined number.

The error signal generator 11 generates an error signal LDI indicating the phase difference between an output signal FR of the first frequency divider 10 and an output signal FN of the second frequency divider 15.

The phase detector circuit 12 compares the frequency and phase of the output signal FR of the first frequency divider 10 with the frequency and phase of the error signal LDI. An output, that is, an error voltage Verr, of the phase detector circuit 12 is an average direct current (DC) voltage proportional to the frequency difference and the phase difference between the output signal, i.e., the lock window signal FR, of the first frequency divider 10 and the output signal, i.e., the signal FN, of the second frequency divider 15.

The low-pass filter 13 removes high frequency components and noise from the error voltage Verr output from the phase detector circuit 12 and determines the dynamic properties of the PLL.

The voltage controlled oscillator 14 adjusts the output frequency $f_0$ thereof such that the error voltage Verr output from the phase detector circuit 12 decreases. The output frequency $f_0$ of the voltage controlled oscillator 14 is usually determined by a value of a pair of devices, that is, a resistor and a capacitor or an inductor and a capacitor, connected to the outside of the voltage controlled oscillator 14.

A PLL lock detector circuit is referred to as a lock condition detector circuit or a phase detector circuit. The PLL lock detector circuit compares the width of a lock window signal, which is arbitrarily set by a designer, with the width of an error signal and determines whether a PLL is locked or unlocked. As a result, a lock or unlock signal is transmitted to a user so that the user can have an advantage in controlling an inner circuit of a larger circuit or in configuring an application circuit or system.

FIG. 2 is a circuit diagram further illustrating the conventional phase detector circuit (a lock detector circuit) shown in FIG. 1. FIG. 3 is a waveform chart illustrating signals corresponding to the operation of the conventional phase detector circuit of FIG. 2.

Referring to FIGS. 2 and 3, a reset signal R initializes a delay (D) flip-flop 20. The conventional phase detector circuit applies a signal XCK/2, obtained by dividing a reference frequency signal by 2, to a control clock terminal CK of the D flip-flop 20 and uses the signal XCK/2 as a lock window signal.

In the conventional phase detector circuit of FIG. 2, the phase of the lock window signal XCK/2 is frequently not the same as that of an error signal LDI. Moreover, since the conventional phase detector circuit detects the state of the error signal LDI only at one edge of the rising and falling edges of the lock window signal, an actually locked PLL may be determined to be unlocked and an actually unlocked PLL may be determined to be locked.

SUMMARY OF THE INVENTION

To solve the above and other related problems of the prior art, there is provided a lock detector circuit for preventing erroneous determinations of a lock or unlock state. Moreover, there is provided a lock detection method for increasing the accuracy of determining a lock or unlock state by detecting the states of an error signal at both rising and falling edges of a lock window signal.

According to an aspect of the invention, there is provided a phase-locked loop (PLL) lock detector circuit for detecting a lock or unlock state of a PLL circuit. The PLL lock detector circuit includes a synchronization circuit for synchronizing a lock window signal with a reference frequency signal. The lock window signal results from dividing the reference frequency signal by a predetermined number. A rising edge detection circuit receives an output signal of the synchronization circuit and an error signal, and outputs a state of the error signal at a rising edge of the output signal of the synchronization circuit. The error signal indicates a phase difference between the lock window signal and a signal resulting from dividing an output signal of the PLL circuit by a predefined number. A falling edge detection circuit receives the error signal and an inverted lock window signal and outputs a state of the error signal at a rising edge of the inverted lock window signal. A logic circuit performs an AND operation on an output signal of the rising edge detection circuit and an output signal of the falling edge detection circuit, and outputs a signal indicating the lock or unlock state of the PLL circuit.

According to another aspect of the invention, there is provided a method of detecting a lock or unlock state of a phase-locked loop (PLL) circuit. The method includes the step of synchronizing a reference frequency signal with a lock window signal to output a resulting signal of the synchronization. The lock window signal results from dividing the reference frequency signal by a predetermined number. A state of an error signal is detected at a rising edge of the resulting signal of the synchronization. The error signal indicates a phase difference between the lock window signal and a signal that results from dividing an output signal of the PLL circuit by a predefined number. A state of the error signal is detected at a rising edge of an inverted lock window signal. An AND operation is performed with respect to the detected states of the error signal, to determine the lock or unlock state of the PLL circuit.

These and other aspects, features and advantages of the present invention will become apparent from the following detailed description of preferred embodiments, which is to be read in connection with the accompanying drawings.

BRIEF DESCRIPTION OF THE DRAWINGS

FIG. 8 is a waveform chart illustrating signals corresponding to a case wherein a PLL circuit is recognized as to be unlocked and the phase of a lock window signal FR lags behind the phase of a signal FN, according to the illustrative embodiment of the present invention shown in FIG. 4;

DETAILED DESCRIPTION OF PREFERRED EMBODIMENTS

Figure 1:
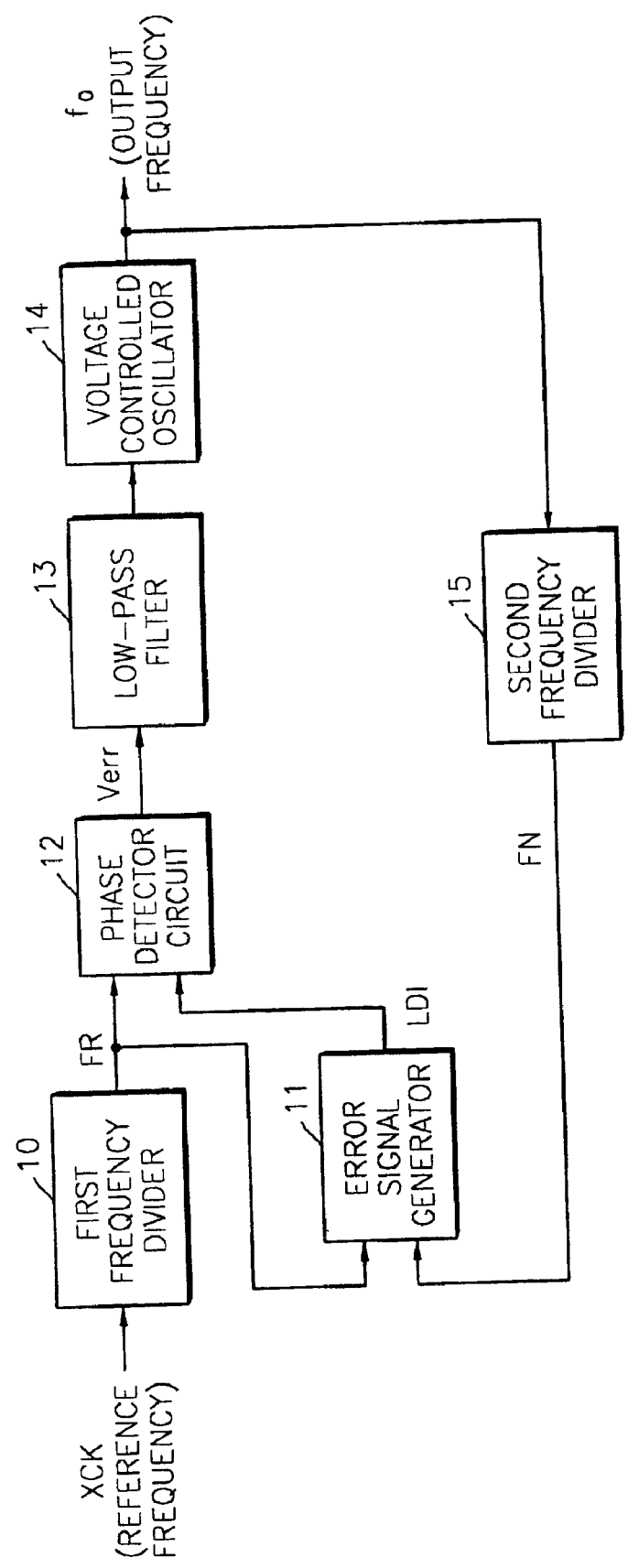
FIG. 1 is a block diagram illustrating an example of a conventional phase-locked loop (PLL) circuit.
Figure 2:
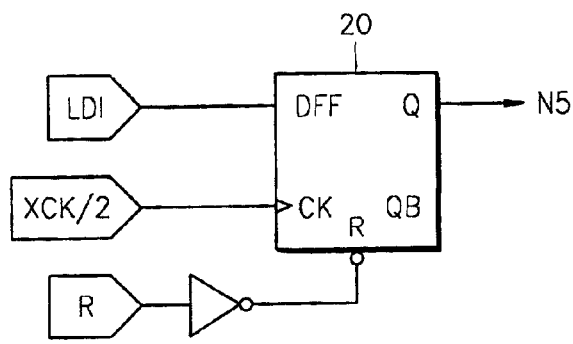
FIG. 2 is a circuit diagram further illustrating a conventional phase detector circuit (a lock detector circuit) shown in FIG. 1.
Figure 3:
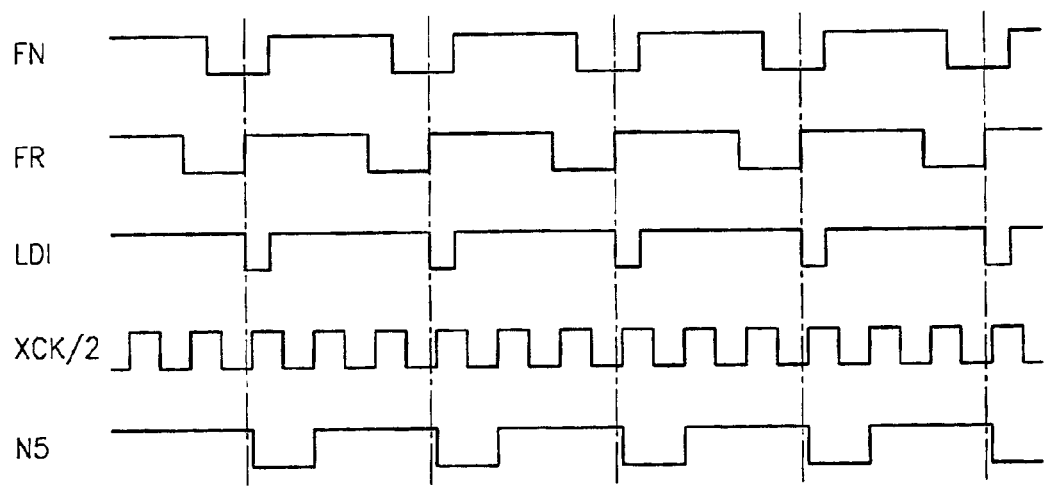
FIG. 3 is a waveform chart illustrating signals corresponding to the operation of the conventional phase detector circuit shown in FIG. 2.

Hereinafter, the present invention will be described in detail by explaining a preferred embodiment of the present invention with reference to the attached drawings. Like reference numerals in the drawings denote the same members.

Figure 4:
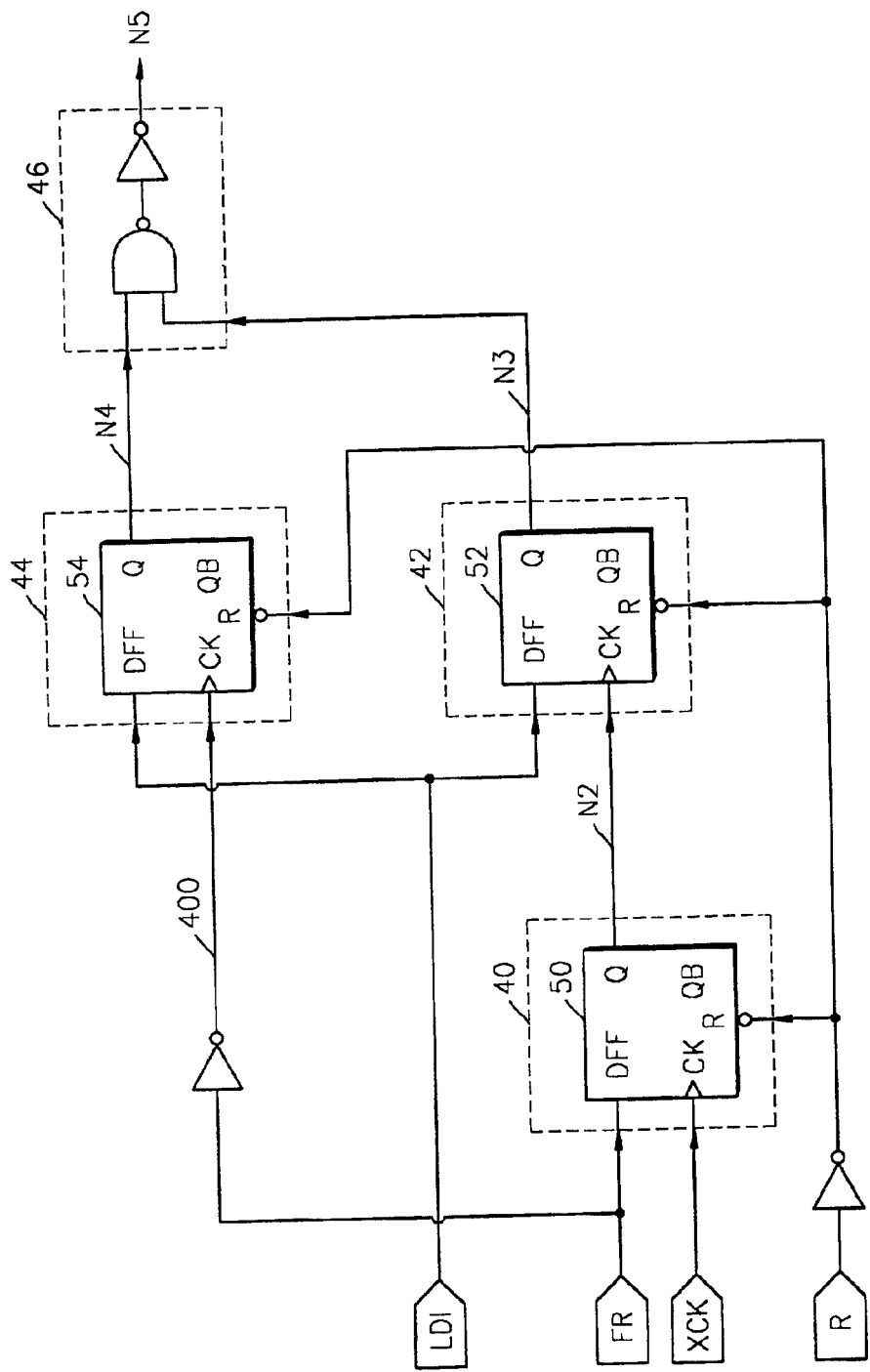
FIG. 4 is a circuit diagram illustrating a PLL lock detector circuit that employs a lock detection method according to an illustrative embodiment of the present invention.

FIG. 4 is a circuit diagram illustrating a PLL lock detector circuit that employs a lock detection method according to an illustrative embodiment of the present invention. The phase-locked loop (PLL) lock detector circuit includes a synchronization circuit 40, a rising edge detection circuit 42, a falling edge detection circuit 44 and a logic circuit. The PLL lock detector circuit operates according to a lock detection method of the present invention.

The synchronization circuit 40 synchronizes a reference frequency XCK with a lock window signal FR obtained by dividing the reference frequency XCK by a predetermined number. By doing this, erroneous determination by the lock detector circuit of a lock or unlock state, which occurs when the lock window signal FR is not synchronized with an error signal LDI, can be prevented when the state of an error signal LDI is detected at a rising edge of the lock window signal FR. Here, the error signal LDI indicates the phase difference between the lock window signal FR and a signal FN obtained by dividing an output frequency $f_0$ of a PLL.

The rising edge detection circuit 42 detects the state of the error signal LDI at a rising edge of a synchronized signal N2 output from the synchronization circuit 40. More specifically, the rising edge detection circuit 42 detects a state of the error signal LDI when the synchronized signal N2 is "low (L)" and outputs the state of the detected error signal LDI when the synchronized signal N2 transitions to a "high (H)" state.

The falling edge detection circuit 44 detects the state of the error signal LDI at a rising edge of an inverted signal 400 of the lock window signal FR. More specifically, the falling edge detection circuit 44 detects a state of the error signal LDI when the inverted signal 400 of the lock window signal FR is "L" and outputs the detected state of the error signal LDI when the inverted signal 400 of the lock window signal FR transitions to a "H" state. In other words, the state of the error signal LDI is detected at the falling edge of the lock window signal FR.

The logic circuit 46 performs an AND operation on an output N3 of the rising edge detection circuit 42 and an output N4 of the falling edge detection circuit 44 and outputs a signal N5 indicating the lock or unlock state of the PLL.

As described above, in a lock detection method of the present invention, the states of the error signal LDI are detected at two positions, that is, at a rising edge of the signal N2 obtained by synchronizing the reference frequency XCK with the lock window signal FR and at a falling edge of the lock window signal FR, and an AND operation is performed on the detected two signals N3 and N4 to indicate the lock or unlock state of a PLL. By using this method, the erroneous determination by the lock detector circuit of the lock or unlock state of a PLL can be prevented.

According to the illustrative embodiment of the present invention shown in FIG. 4, the synchronization circuit 40, the rising edge detection circuit 42 and the falling edge detection circuit 44 which form a lock detector circuit may include delay (D) flip-flops having the same structure as described herein.

A D flip-flop 50 of the synchronization circuit 40 receives the lock window signal FR through a D input terminal DFF and receives the reference frequency XCK through a control clock terminal CK. Accordingly, the lock window signal FR is delayed by one period of the reference frequency XCK signal and then output, through an output terminal Q of the D flip-flop 50 in synchronization with the reference frequency XCK signal and without a change in phase, as the signal N2.

A D flip-flop 52 of the rising edge detection circuit 42 receives the error signal LDI through a D input terminal DFF and receives the output signal N2 of the synchronization circuit 40 through a control clock terminal CK. Accordingly, the rising edge detection circuit 42 detects a state of the error signal LDI when the output signal N2 of the synchronization circuit 40 is "L" and outputs the detected state of the error signal LDI when the output signal N2 of the synchronization circuit 40 transitions to a "H" state.

A D flip-flop 54 of the falling edge detection circuit 44 receives the error signal LDI through a D input terminal DFF and receives the inverted signal 400 of the lock window signal FR through a control clock terminal CK. Accordingly, the falling edge detection circuit 44 detects a state of the error signal LDI when the inverted signal 400 of the lock window signal FR is "L" and outputs the detected state of the error signal LDI when the signal 400 transitions to a "H" state. Here, outputting a signal at a rising edge of the inverted signal 400 of the lock window signal FR means outputting the signal at a falling edge of the lock window signal FR which is an original signal before phase inversion.

The logic circuit 46 that outputs the final output signal N5 of the lock detector circuit may include a NAND gate and an inverter for inverting phase. When either of the output N3 of the rising edge detection circuit 42 or the output N4 of the falling edge detection circuit 44 is in a "L" state, the final output N5 is in a "L" state. When the final output N5 is in a "L" state, this means that the PLL is unlocked. When the two signals N3 and N4 are both in a "H" state, that is, when the width of the error signal LDI is smaller than that of the lock window signal FR, the output signal N5 is in a "H" state indicating that the PLL is locked.

To further illustrate the operation characteristics of the PLL lock detector circuit of FIG. 4, four illustrative cases are provided below which depend on the relationships between phase positions of the lock window signal FR and the signal FN. The results of simulations for the cases are shown in FIGS. 5 through 8.

Once a reset signal R is applied to the PLL lock detector circuit (the reset signal is in a "H" state), the outputs N2, N3 and N4 and the final output N5 of the respective circuits of FIG. 4 are in a "L" state. After the reset signal R is released (in a "L" state), when the reference frequency XCK signal first transitions from the "L" state to the "H" state, the voltage state of the lock window signal FR appears at the output N2 of the synchronization circuit 40. Accordingly, the output N2 of the synchronization circuit 40 is a signal obtained by delaying the lock window signal FR by about one period of the reference frequency XCK signal and is synchronous with the reference frequency XCK signal. According to the waveforms illustrated in FIG. 5, the output N2 of the synchronization circuit 40 is in a "H" state at this moment.

When the output N2 of the synchronization circuit 40 transitions from the "L" state to the "H" state, that is, at a rising edge of the lock window signal FR, a state of the error signal LDI appears at the output N3 of the rising edge detection circuit 42. According to the waveforms illustrated in FIG. 5, the output N3 of the rising edge detection circuit 42 is in a "H" state at this moment.

A state of the error signal LDI appears at the output N4 of the falling edge detection circuit 44 at a rising edge where the inverted signal 400 of the lock window signal FR transitions from the "L" state to the "H" state, that is, at a falling edge where the lock window signal FR transitions from the "H" state to the "L" state. According to the waveforms illustrated in FIG. 5, the output N4 of the falling edge detection circuit 44 is in a "H" state at this moment.

The final output N5 of the logic circuit 46 is determined depending on the values of the output signals N3 and N4. According to FIG. 5, when the output N4 of the falling edge detection circuit 44 transitions to a "H" state in a state where the output N3 of the rising edge detection circuit 42 is in a "H" state, the final output N5 of the logic circuit 46 transitions to a "H" state, thereby indicating that the PLL is locked.

When the final output N5 of the logic circuit 46 is in the "H" state, that is, when the PLL is locked, the output frequency $f_0$ of the voltage controlled oscillator does not change because the width of the error signal LDI is smaller than that of the lock window signal FR.

Figure 5:
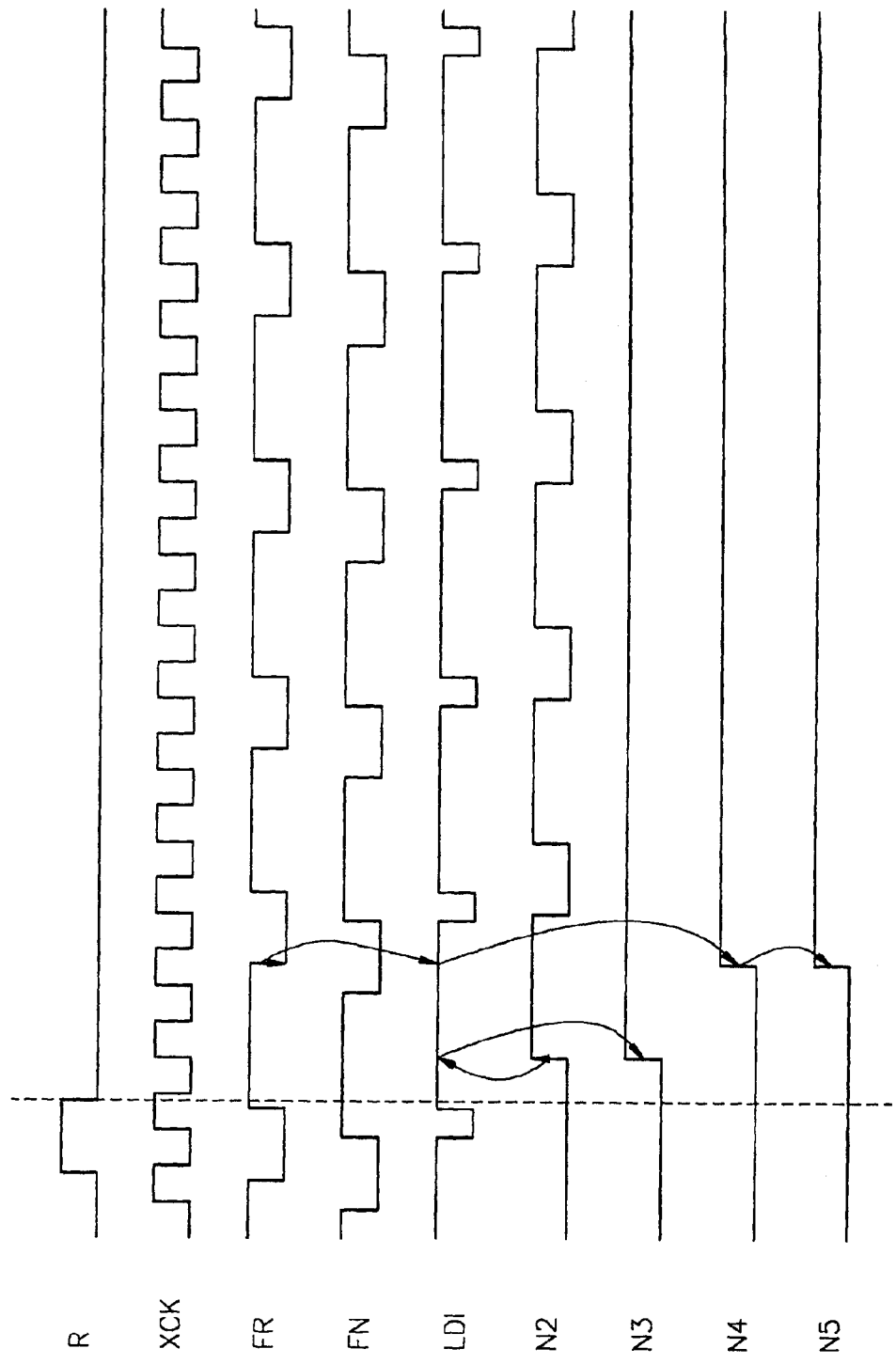
FIG. 5 is a waveform chart illustrating signals corresponding to a case wherein a PLL circuit is recognized as being locked and the phase of a lock window signal FR lags behind the phase of a signal FN, according to the illustrative embodiment of the present invention shown in FIG. 4.
Figure 6:
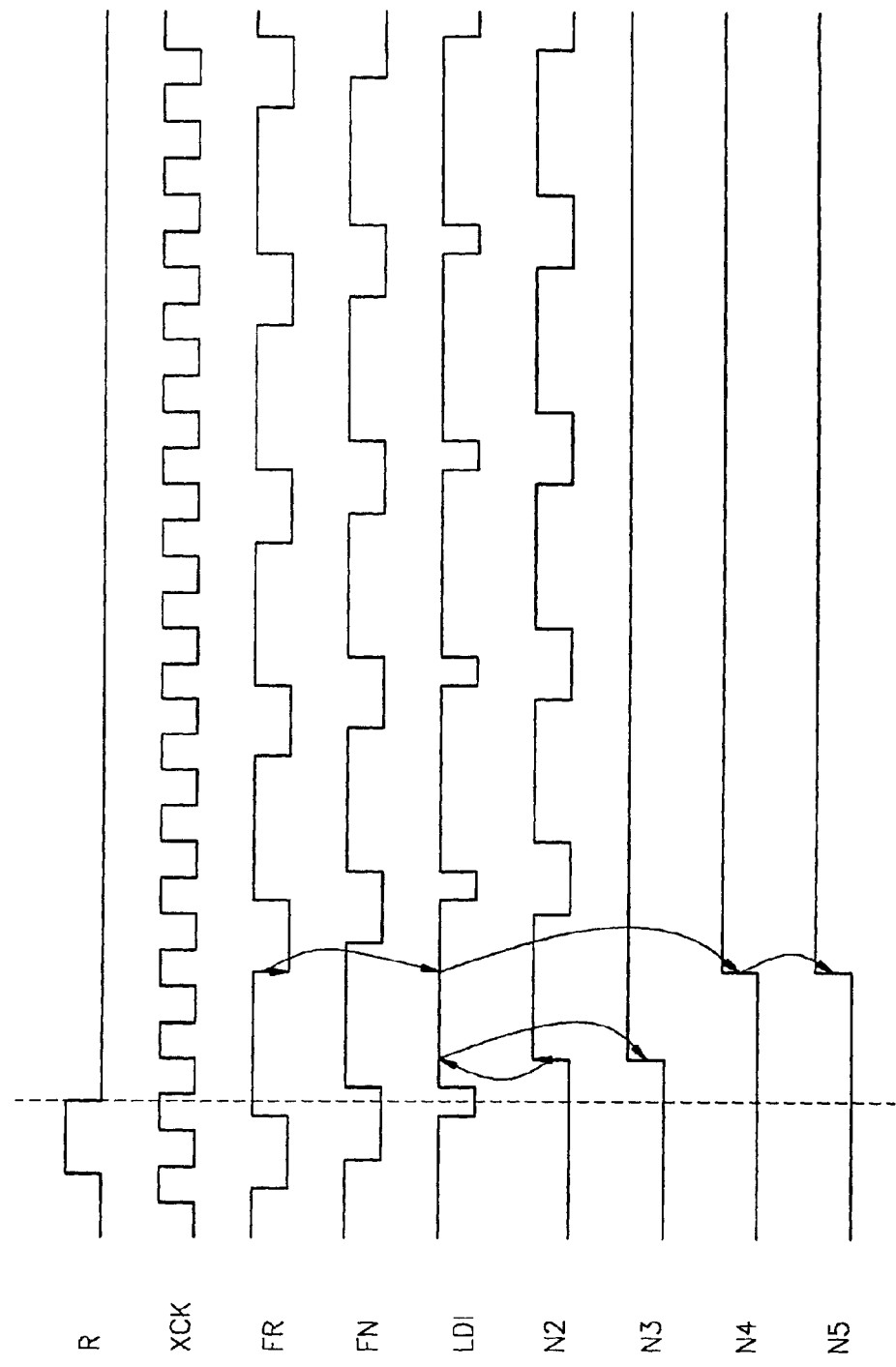
FIG. 6 is a waveform chart illustrating signals corresponding to a case wherein a PLL circuit is recognized as being locked and the phase of a lock window signal FR leads the phase of a signal FN, according to the illustrative embodiment of the present invention shown in FIG. 4.

FIG. 5 illustrates a case where the phase of the signal FN slightly leads that of the lock window signal FR. On the other hand, FIG. 6 illustrates a case where the phase of the lock window signal FR slightly leads that of the signal FN. In the two cases of FIGS. 5 and 6, the width of the error signal LDI is smaller than that of the lock window signal FR. Accordingly, the final output N5 is in a "H" state in both cases of FIGS. 5 and 6.

Figure 7:
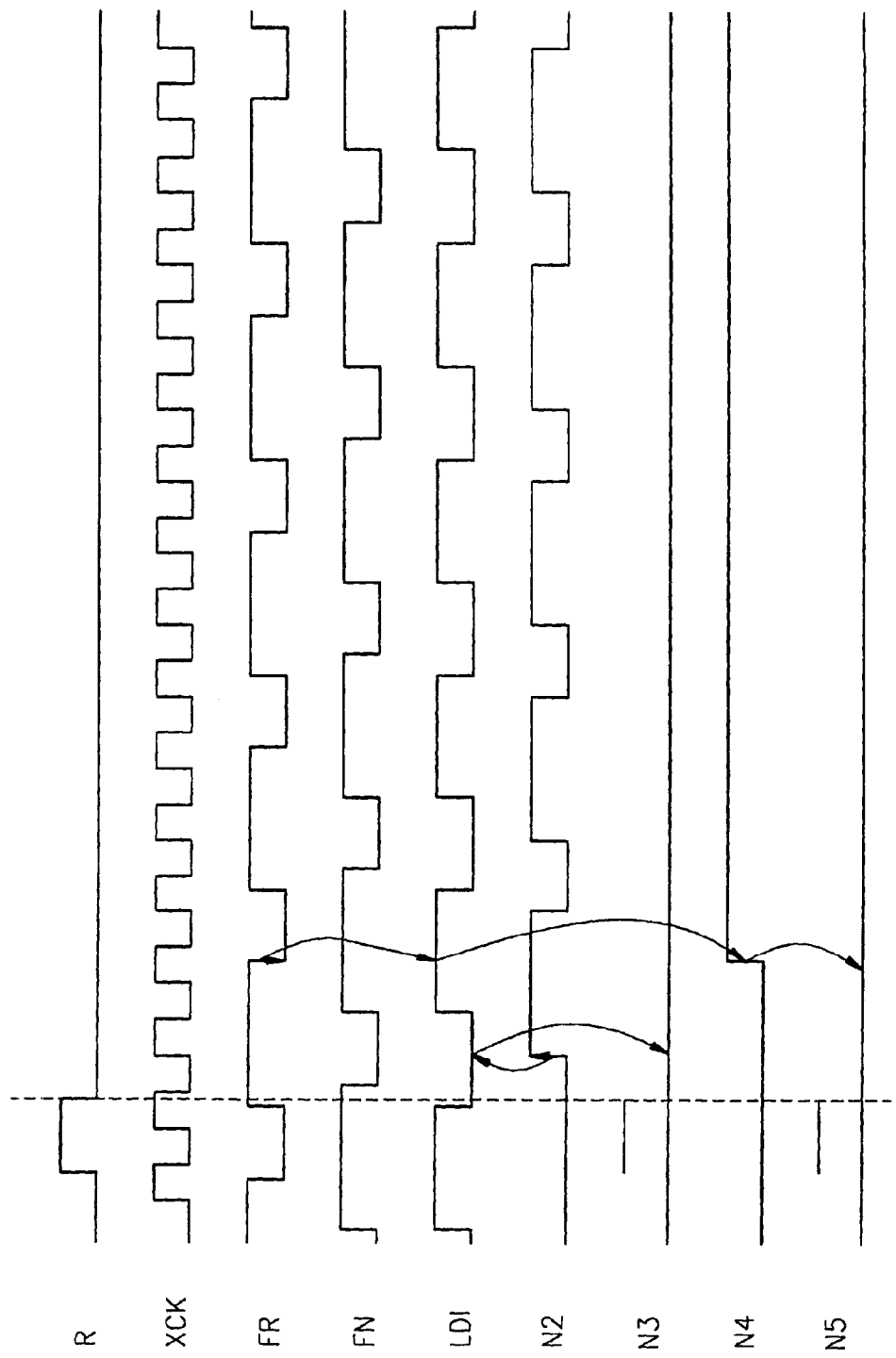
FIG. 7 is a waveform chart illustrating signals corresponding to a case wherein a PLL circuit is recognized as to be unlocked and the phase of a lock window signal FR leads the phase of a signal FN, according to the illustrative embodiment of the present invention shown in FIG. 4.

However, in FIGS. 7 and 8, the width of the error signal LDI indicating the phase difference between the lock window signal FR and the signal FN exceeds that of the lock window signal FR. In FIG. 7, after the reset signal R is released (the reset signal R is in a "L" state), it is detected that the width of the error signal LDI exceeds that of the lock window signal FR at a rising edge of the output N2 of the synchronization circuit 40, i.e., the lock window signal FR synchronized with the reference frequency XCK. Accordingly, the final output N5 of the PLL lock detector circuit is in a "L" state indicating the unlock stated of a PLL regardless of the state of the output N4 of the falling edge detection circuit 44.

In FIG. 8, after the reset signal R is released, it is detected that the width of the error signal LDI exceeds that of the lock window signal FR at a falling edge of the lock window signal FR. Accordingly, the final output N5 of the PLL lock detector circuit is in a "L" state indicating the unlock state of a PLL regardless of the state of the output N3 of the rising edge detection circuit 42.

In FIG. 7, the condition of a lock state is detected at a rising edge of the signal N2 resulting from synchronizing the lock window signal FR with the reference frequency XCK signal. In FIG. 8, the condition of a lock state is detected at a rising edge of the inverted signal 400 of the lock window signal FR, that is, at a falling edge of the lock window signal FR. As a result, the final output N5 of the logic circuit 46, which is used to indicate that the width of the error signal LDI exceeds that of the lock window signal FR, is in a "L" state.

As described above, a PLL lock detector circuit according to the present invention synchronizes the lock window signal FR with the reference frequency XCK signal, detects the states of the error signal LDI at a rising edge of the signal N2 resulting from the synchronization and at a falling edge of the lock window signal FR before the synchronization, and determines whether a PLL is locked or unlocked based on the result of performing an AND operation on the detected two signals N3 and N4. A PLL lock detector circuit according to the present invention is designed so that erroneous determination of the lock or unlock state of a PLL can be prevented.

Figure 9A:
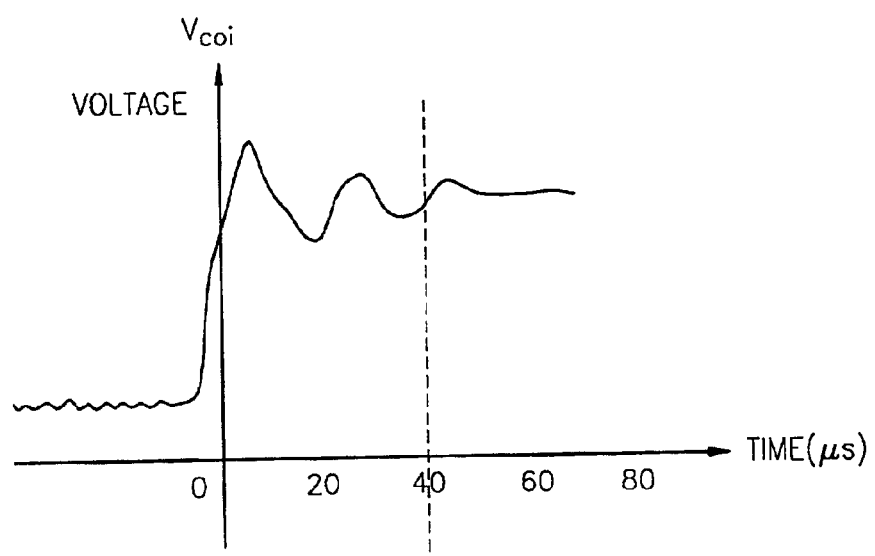
FIG. 9A is a waveform chart illustrating a direct current (DC) voltage input to a voltage controlled oscillator (VCO.) of a PLL formed in a chip in which a PLL lock detector circuit is implemented according to an illustrative embodiment of the present invention.
Figure 9B:
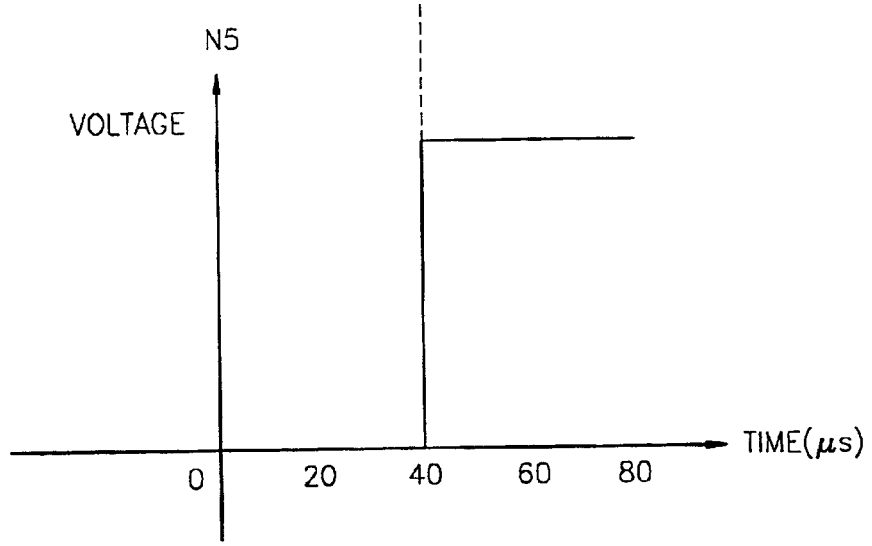
FIG. 9B is a waveform chart illustrating an output of a PLL lock detector circuit of a PLL formed in a chip in which the PLL lock detector circuit is implemented according to an illustrative embodiment of the present invention.

Referring to FIGS. 9A and 9B, in a case where a PLL is formed, a PLL lock detector circuit according to the present invention does not output the output N5 indicating the lock state of a PLL circuit until the frequency of the voltage controlled oscillator (14 of FIG. 1) changes; that is, the output N5 is not output until the input direct current (DC) voltage of the voltage controlled oscillator 14 transitions from a "L" state to a "H" state and is converged on a predetermined voltage value to satisfy the condition of a lock state of the PLL circuit.

As described above, the PLL lock detector circuit and the lock detection method according to the present invention advantageously detect the difference between pulse widths of two signals without error.

Although the illustrative embodiments have been described herein with reference to the accompanying drawings, it is to be understood that the present system and method is not limited to those precise embodiments, and that various other changes and modifications may be affected therein by one skilled in the art without departing from the scope or spirit of the invention. All such changes and modifications are intended to be included within the scope of the invention as defined by the appended claims.

What is claimed is:

1. A phase-locked loop (PLL) lock detector circuit for detecting a lock or unlock state of a PLL circuit, the PLL lock detector circuit comprising:
   a synchronization circuit for synchronizing a lock window signal with a reference frequency signal, the lock window signal resulting from dividing the reference frequency signal by a predetermined number;
   a rising edge detection circuit for receiving an output signal of the synchronization circuit and an error signal, and for outputting a state of the error signal at a rising edge of the output signal of the synchronization circuit, the error signal indicating a phase difference between the lock window signal and a signal resulting from dividing an output signal of the PLL circuit by a predefined number;
   a falling edge detection circuit for receiving the error signal and an inverted lock window signal and for outputting a state of the error signal at a rising edge of the inverted lock window signal; and
   a logic circuit for performing an AND operation on the output signal of the rising edge detection circuit and the output signal of the falling edge detection circuit, and for outputting a signal indicating the lock or unlock state of the PLL circuit.

2. The PLL lock detector circuit of claim 1, wherein the synchronization circuit comprises a delay flip-flop having a control clock terminal, a delay input terminal, an output terminal and an inverting output terminal, the reference frequency signal is applied to the control clock terminal, and the lock window signal is applied to the delay input terminal.

3. The PLL lock detector circuit of claim 1, wherein the rising edge detection circuit comprises a delay flip-flop having a control clock terminal, a delay input terminal, an output terminal and an inverting output terminal, the output of the synchronization circuit is applied to the control clock terminal, and the error signal is applied to the delay input terminal.

4. The PLL lock detector circuit of claim 1, wherein the falling edge detection circuit comprises a delay flip-flop having a control clock terminal, a delay input terminal, an output terminal and an inverting output terminal, the inverted lock window signal is applied to the control clock terminal, and the error signal is applied to the delay input terminal.

5. The PLL lock detector circuit of claim 1, further comprising an inverter for inverting the lock window signal to output the inverted lock window signal.

6. A method of detecting a lock or unlock state of a phase-locked loop (PLL) circuit, comprising the steps of:
   synchronizing a reference frequency signal with a lock window signal to output a resulting signal of the synchronization, the lock window signal resulting from dividing the reference frequency signal by a predetermined number;
   detecting a state of an error signal at a rising edge of the resulting signal of the synchronization, the error signal indicating a phase difference between the lock window signal and a signal that results from dividing an output signal of the PLL circuit by a predefined number;
   detecting a state of the error signal at a rising edge of an inverted lock window signal; and
   performing an AND operation with respect to the detected states of the error signal, to determine the lock or unlock state of the PLL circuit.

7. The method of claim 6, wherein said step of synchronizing the reference frequency signal with the lock window signal comprises a step of inputting the lock window signal and the reference frequency signal to a data input and a clock input of a flip flop, respectively, to obtain the resulting signal of the synchronization from an output of the flip flop.

8. The method of claim 6, wherein said step of detecting the state of the error signal at the rising edge of the resulting signal of the synchronization comprises a step of inputting the error signal and the resulting signal of the synchronization to a data input and a clock input of a flip flop, respectively, to obtain the state of the error signal at the rising edge of the resulting signal of the synchronization from an output of the flip flop.

9. The method of claim 6, wherein said step of detecting the state of the error signal at the rising edge of the inverted lock window signal comprises a step of inputting the error signal and the inverted lock window signal to a data input and a clock input of a flip flop, respectively, to obtain the state of the error signal at the rising edge of the inverted lock window signal output from an output of the flip flop.

10. A phase-locked loop (PLL) lock detector circuit for detecting a lock or unlock state of a PLL circuit, the PLL lock detector circuit comprising:
    a synchronization circuit for synchronizing a lock window signal with a reference frequency signal, the lock window signal resulting from dividing the reference frequency signal by a predetermined number;
    a detection circuit for receiving an output signal of the synchronization circuit and an error signal, for outputting a state of the error signal at a rising edge of the output signal of the synchronization circuit, for receiving an inverted lock window signal and for outputting a state of the error signal at a rising edge of the inverted lock window signal, the error signal indicating a phase difference between the lock window signal and a signal resulting from dividing an output signal of the PLL circuit by a predefined number; and
    a logic circuit for performing an AND operation with respect to the outputted states and for outputting a signal indicating the lock or unlock state of the PLL circuit.

11. The PLL lock detector circuit of claim 10, wherein said detection circuit comprises:
    a rising edge detection circuit for receiving the output signal of the synchronization circuit and the error signal, and for outputting the state of the error signal at the rising edge of the output signal of the synchronization circuit; and
    a falling edge detection circuit for receiving the error signal and the inverted lock window signal and for outputting the state of the error signal at the rising edge of the inverted lock window signal.

12. The PLL lock detector circuit of claim 10, wherein the synchronization circuit comprises a flip-flop having a control clock terminal, a data input terminal, an output terminal and an inverting output terminal, the reference frequency signal is applied to the control clock terminal, and the lock window signal is applied to the data input terminal.

13. The PLL lock detector circuit of claim 11, wherein the rising edge detection circuit comprises a flip-flop having a control clock terminal, a data input terminal, an output terminal and an inverting output terminal, the output of the synchronization circuit is applied to the control clock terminal, and the error signal is applied to the data input terminal.

14. The PLL lock detector circuit of claim 11, wherein the falling edge detection circuit comprises a flip-flop having a control clock terminal, a data input terminal, an output terminal and an inverting output terminal the inverted lack window signal is applied to the control clock terminal, and the error signal is applied to the data input terminal.

* * * * *